(12) United States Patent
Akiho et al.

(10) Patent No.: US 6,553,787 B1
(45) Date of Patent: Apr. 29, 2003

(54) METHOD FOR MANUFACTURING QUARTZ GLASS CRUCIBLE

(75) Inventors: Kazuhiro Akiho, Saitama (JP); Masaki Kusuhara, Saitama (JP); Hiroyuki Watanabe, Saitama (JP); Tomoyasu Uno, Saitama (JP)

(73) Assignee: Nanwa Quartz, Inc., Tokyo (JP)

( * ) Notice: Subject to any disclaimer, the term of this patent is extended or adjusted under 35 U.S.C. 154(b) by 0 days.

(21) Appl. No.: 09/701,427

(22) PCT Filed: Mar. 30, 2000

(86) PCT No.: PCT/JP00/02010

§ 371 (c)(1),
(2), (4) Date: Feb. 5, 2001

(87) PCT Pub. No.: WO00/59837

PCT Pub. Date: Oct. 12, 2000

(30) Foreign Application Priority Data

Apr. 6, 1999 (JP) ............................................. 11-98458
Dec. 17, 1999 (JP) .......................................... 11-359937

(51) Int. Cl.$^7$ .......................... C03B 19/01; C03B 19/09
(52) U.S. Cl. .......................... 65/17.3; 65/17.4; 65/32.1; 65/134.9; 65/136.1; 65/135.6; 65/144; 65/157; 65/302; 65/DIG. 4

(58) Field of Search ................................. 65/17.3, 17.4, 65/32.1, 134.9, 136.1, 135.6, 144, 157, 302, DIG. 4

(56) References Cited

U.S. PATENT DOCUMENTS

| | | | |
|---|---|---|---|
| 4,935,046 A | | 6/1990 | Uchikawa et al. ............ 65/18.2 |
| 5,762,672 A | * | 6/1998 | Ikeda et al. ................... 65/17.3 |

* cited by examiner

Primary Examiner—Michael Colaianni
(74) Attorney, Agent, or Firm—Armstrong, Westerman & Hattori, LLP

(57) ABSTRACT

Present invention suppresses undesirable effects of the bubbles trapped in a silica glass crucible on single crystallization during the pulling process under a high-temperature load. When raw material powder is melted in a mold 1, graphite components of electrodes and impurities contained in the raw material are removed by introducing hydrogen gas and/or oxygen gas immediately after the start of arc discharge. Graphite and impurities are prevented from entering the product crucible, thereby suppressing the volume increase rate of the bubbles and reducing the inner pressure of the bubbles. Gases remaining in voids of an accumulated layer of silica powder formed inside the mold 1 can be replaced with helium gas, by supplying helium gas to the accumulated layer from the mold 1.

37 Claims, 5 Drawing Sheets

| SAMPLE NO. | 1 | 2 | 3 | 4 | 5 |
|---|---|---|---|---|---|
| MEAN OF BUBBLE DIAMETER($\mu$m) | 100 | 150 | 200 | 250 | 300 |
| YIELD OF SINGLE CRYSTAL(%) | 100 | 100 | 85 | 80 | 80 |

| | | NOT USED | USED |
|---|---|---|---|
| BUBBLE SIZE | MAX. | 51 μm | 90 μm |
| | MIN. | 3 μm | 9 μm |
| | MEAN | 13 μm | 34 μm |
| NUMBER OF BUBBLE | | 0.14/mm³ | 0.27/mm³ |

| NUMBER, SIZE(DIA.), EXPANSION RATIO OF BUBBLE IN OPAQUE LAYER | | | | |
|---|---|---|---|---|
| | PRIOR ART | | INVENTION (SAMPLE) | |
| | NUMBER | DIAMETER | NUMBER | DIAMETER |
| NOT USED | 26 | 0.049 | 24 | 0.050 |
| USED | 17 | 0.197 | 20 | 0.071 |
| EXPANSION RATIO | | ×4.02 | | ×1.42 |

Fig. 8
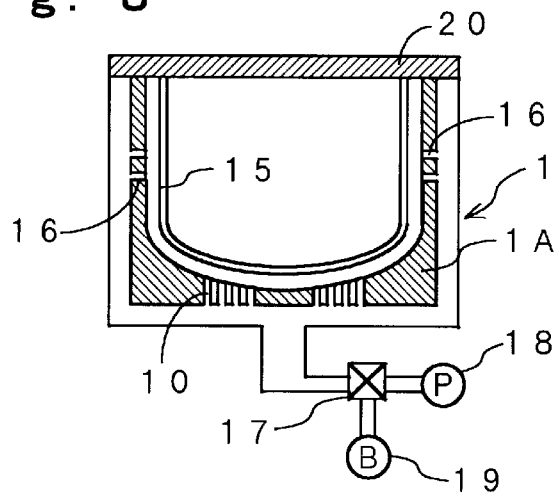
Fig. 9
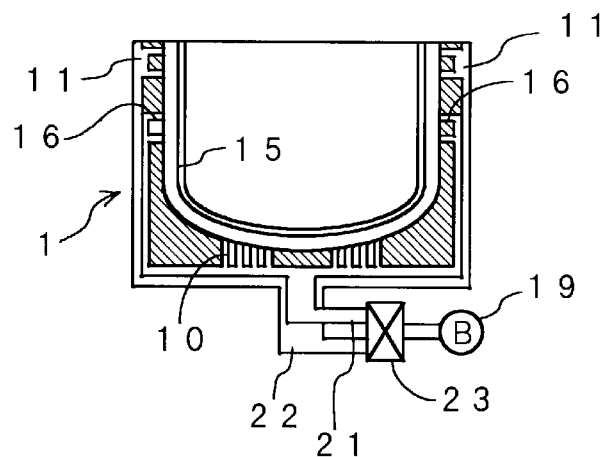
Fig. 10
| NUMBER, SIZE(DIA.), EXPANSION RATIO OF BUBBLE IN OPAQUE LAYER | | | | |
|---|---|---|---|---|
| | SAMPLE II (5 TORR) | | SAMPLE III (160 TORR) | |
| | NUMBER | DIAMETER | NUMBER | DIAMETER |
| NOT USED | 25 | 0.045 | 24 | 0.040 |
| USED | 21 | 0.056 | 20 | 0.100 |
| EXPANSION RATIO | | ×1.40 | | ×2.5 |

METHOD FOR MANUFACTURING QUARTZ GLASS CRUCIBLE

TECHNICAL FIELD

The present invention relates to a method of producing a silica glass crucible, and especially to a method of producing a silica glass crucible which can improve the yield of semiconductor single crystal when used for pulling of semiconductor single crystal.

BACKGROUND

As a method of producing semiconductor single crystal such as silicon single crystal, "the pulling method" (Czochralski method or CZ method), in which seed crystals as cores are immersed in a liquid surface of molten semiconductor materials such that single crystal is grown from the seed crystal, is known. A silica glass crucible is employed for melting semiconductor materials. In recent years, in order to reduce the production cost in the pulling process of single crystal, Multi-pulling method or large-diameter silicon single crystal pulling method has been attempted. However, in the case of such new methods, a silica glass crucible of a large inside or inner diameter are often required.

When the inner diameter of the silica glass crucible is increased and a large amount of semiconductor materials are melted in the silica glass crucible, the melting time becomes longer and thus a longer time is required for entire pulling process. In order to shorten the time requited for the pulling process, increasing the amount of heat (the amount of inputted heat) which is given to the silica glass crucible by a heater is one possible solution. Further, it is preferable that the amount of inputted heat is relatively large for maintaining the temperature of a large amount of the liquid of the semiconductor materials at a predetermined temperature.

However, when the amount of the inputted heat is large, the following undesirable outcomes may occur. It is known that a considerable amount of gaseous components is mixed into the silica glass crucible from the air during the production process and remains as bubbles therein. These bubbles tend to expand when the silica glass crucible is used at a high temperature, and the bubbles present in the transparent layer as the inner surface layer of the crucible, in particular, tend to explode as a result of increase in volume thereof. Pieces of silica glass resulted from such explosions are mixed into the liquid of silicon, transferred in the melt liquid as cristobalite by convection, and may be deposited to the lower end of single crystal of silicon which are in the midst of the pulling process. The single crystal may then collapse from the portion at which the silica glass piece is deposited, thereby deteriorating the yield of the semiconductor single crystal. This undesirable phenomenon becomes more significant when the amount of inputted heat is increased or the heat load is increased as the time required for the pulling process is prolonged, due to use of the silica glass crucible of a large inside diameter. The larger the number or the size of the bubbles present in the transparent layer is, or the larger the volume increasing rate of the bubbles during the single crystal pulling process is, the more easily the bubbles explode.

As a method of producing silica glass which has a highly transparent glass layer having a relatively small amount of bubbles, there exists a known method in which silica glass is produced by melting silica sand powder in a high-temperature atmosphere. Known examples of such a method include what are called the oxygen-hydrogen Verneuil's method, the arc Verneuil's method, the plasma-Verneuil's method and the like, which are different from each other in types of the heat source which forms the high-temperature atmosphere. Attempts have been made so as to apply these melting methods to the production of the silica glass crucible and make substantially eliminate bubbles in the silica glass crucible. For example, in publication of examined patent application No. Hei 4-22861, a method of producing a silica glass crucible is proposed in which a transparent layer is formed in the inner surface portion of the crucible (by using the arc Verneuil's method, the inner surface portion is made to come into direct contact with the liquid of molten silicon during the pulling process).

In publication of unexamined application No. Hei 8-268727, a method of producing a quartz crucible is disclosed which method includes the steps of: centrifuging silica sand put in a melting pot such that the silica sand has the bowl-like shape; heating the silica sand of bowl-like shape; introducing a rapidly-diffusing gas into the silica sand of bowl-like shape from the outer surface thereof so as to purge remaining gases contained in voids which are formed between every particles of silica sand. In addition, in this method of producing a quartz crucible, vacuum is applied to the bottom of the melting pot of the silica sand such that a flow of the rapidly-diffusing gas is generated, in order to purge the remaining gases from the voids of the silica sand.

In the case of the method of producing a silica glass crucible disclosed in the former of the aforementioned two references, a problem, that the method may not be able to adapt to the current pulling process to a sufficient degree because the heat load is increased or the time required for the pulling process is prolonged due to use of a larger inner diameter of silicon single crystal or introduction of the "multi-pulling" process, may arise. Accordingly, there has been a demand for a silica glass crucible in which bubbles present in the inner surface layer are less likely to explode even when the heat load is relatively large or the time required for the pulling process is relatively long.

According to the method of producing a quartz crucible disclosed in the latter of the aforementioned references, the growth of bubbles in the silica glass crucible during the high-temperature heating process in, for example, manufacturing semiconductor single crystals can be prevented because the gases remaining in the voids of the silica sand are replaced with the rapidly-diffusing gas. However, as the remaining gases (nitrogen gas or oxygen gas) are still not sufficiently replaced with the rapidly-diffusing gas in this production method, bubbles present in the opaque layer tend to increase volume thereof when the crucible is used (i.e., during the pulling process), thereby deteriorating the heat conductivity of the quartz crucible and thus raising the temperature of the quartz crucible. As a result, the bubbles in the transparent layer are also likely to explode.

In general, nitrogen gas and the like trapped in the voids of the silica sand has a larger density than hydrogen gas which is the rapidly-diffusing gas. Accordingly, due to the difference between the density of nitrogen gas and that of hydrogen gas, hydrogen gas simply passes through the voids and thus it takes a long time to complete replacing of nitrogen gas with hydrogen gas. As a result, when the rapidly-diffusing gas is blown into the silica sand for only a short period, the replacement cannot be performed sufficiently and a considerable amount of nitrogen gas and the like are likely to remain in the voids. These remaining gases become the bubbles present in the inner surface layer of the silica glass crucible. In short, according to this method, the number of the bubbles in the crucible remains substantially the same as in the conventional method and cannot be reduced.

In addition, the increase in the amount of inputted heat may also influence the pulling process of semiconductor single crystal. During the pulling process, the silica glass crucible is supported at the outer periphery thereof by a holding member made of graphite, and the holding member is heated by a heater. That is, the semiconductor material in the silica glass crucible is heated by the heater by way of the holding member.

The more transparent the silica glass crucible is, the more effectively the heat from the heater is transferred to the semiconductor materials. However, as a plurality of heater elements are provided with a space between each other, if the silica glass crucible is completely transparent, heat from the heater elements tends to be directly transferred to the semiconductor materials in the silica glass crucible and the semiconductor materials located between the heater elements may not be able to receive heat at a sufficient level. Therefore, in order to make the heat be evenly transferred, an opaque layer containing an appropriate number of bubbles is formed in the vicinity of the outer periphery of the silica glass crucible, such that heat rays emitted from the heater are dissipated in the multiple directions and the distribution thereof is made even when the heat rays pass through the silica glass crucible.

When the number of the bubbles present in the opaque layer or the size of such bubbles is too large, it becomes difficult for the heat rays emitted from the heater to reach the transparent layer side and the liquid of molten semiconductor in the crucible may not be able to receive heat efficiently. When the bubbles increase volume thereof by heating, in particular, heat tends to remain inside the silica glass crucible due to the decreased heat conductivity and the temperature of the silica glass crucible itself may rise up to an extremely high level, in spite that the liquid of molten semiconductor cannot receive sufficient heat.

When the temperature of the silica glass crucible has risen to an extremely high level, devitrification occurs in the vicinity of 1550° C. Further, in case the heat from the heater is not sufficiently transferred to the liquid of molten semiconductor material in the silica glass crucible, the temperature of the liquid of molten semiconductor material may be locally dropped, there by causing icing (local solidification).

Therefore, a silica glass crucible, in which the inputted heat effectively acts on the semiconductor materials provided therein and thus the time required for the pulling process can be shortened, any unusual increase in temperature or icing due to the reflection of the heat from the heater toward the heater side is prevented, and the heat from the heater can be evenly transferred to the semiconductor materials and the melt liquid thereof contained in the silica glass crucible, has been demanded.

Further, according to the method of the publication of unexamined application No. Hei 8-268727, as the opening for applying vacuum is provided only at the bottom portion of the mold, it is difficult to make the vacuum degree of inside of the mold higher in a short period of time.

As described above, it is desirable that the number, the size of bubbles present in the inner surface layer of a silica glass crucible, and the volume increasing (expansion) rate of the bubbles (ratio of bubble diameter after/before the pulling process) is reduced, in order to improve the grow th efficiency of single crystals. Further, it is desirable that the bubbles present in the silica glass crucible are less likely to increase volume thereof, so that a stable heat conductivity can be obtained for the outer layer as well.

FIG. 2 shows the results of a research in which the relationship between the average diameter of bubbles and yield of the single crystal in the inner surface layer (1 mm) at the corner portions (i.e., the boundary portions of the bottom portions and the side wall portions) of a silica glass crucible was studied. The corner portion is studied because the corner portion, in particular, experiences a relatively large load during the single crystal pulling process and thus the bubbles present in the corner portion are closely related to the yield of the single crystal.

The silica glass crucible sample used for the research has an inner diameter of 22 inches. The yield was obtained in a condition in which silicon polycrystal of 100 kg was heat melted with maintaining the temperature of the liquid surface at about 1430° C., seedbars of silicon single crystals were immersed in the melting surface, and silicon single crystal of 8 inches were pulled up. Test pieces were collected from the aforementioned silica glass crucible and the diameter of the bubbles at the corner portions and the yield were investigated. In the results, as shown in FIG. 2, the yield deteriorated when the average diameter of the bubbles was 200 mm or larger.

DISCLOSURE OF INVENTION

An object of the present invention is to provide a method of producing a silica glass crucible, in which: the number, the size, and the expansion ratio of the bubbles present in a transparent layer are made small such that explosion of the bubbles is prevented and the yield of the semiconductor single crystal is increased; and the number, the size, and the expansion ratio of the bubbles present in an opaque layer are set appropriate such that the increase in temperature of the silica glass crucible is suppressed and the heat efficiency during the pulling process of semiconductor single crystal is enhanced.

In the first aspect of the present invention, a method of producing a silica glass crucible, in which silica powder is melted by arc discharge between graphite electrodes and a silica glass crucible is formed in a rotating mold, comprising the steps of supplying at least one type of gas selected from the group consisting of hydrogen, oxygen, water vapor, helium, neon gases to the mold; and passing the silica powder through atmosphere of the at least one type of gas supplied at the previous gas supplying step and then supplying the silica powder to inner surface of the mold. Particularly, in the second aspect of the present invention, hydrogen and oxygen gas are supplied to the mold at previous gas supplying step. In the third aspect of the present invention, the silica powder is dispersed inside the mold, such that the silica powder is softened in atmosphere of the arc discharge prior to the silica powder reaching the inner surface of the mold. In the forth aspect of the present invention, the gas and the silica powder are supplied through a double-wall cylinder, particularly, the silica powder is supplied through an inner cylinder and the gas is supplied through an outer cylinder. In the fifth aspect of the present invention, the silica powder is supplied with oxygen gas through as inner cylinder, and hydrogen gas supplied through an outer cylinder. In the sixth aspect of the present invention, a distal end of the inner cylinder is positioned so as to be retracted with respect to a distal end of the outer cylinder. Furthermore, in the seventh aspect of the present invention, of the silica powder and the gas, at least the silica powder is intermittently supplied, while the arc discharge is continued.

According to these aspects of the present invention, the impurities such as alkaline-earth metal and heavy metals contained in the supplied silica powder are replaced with gases such as hydrogen or combusted in a high-temperature atmosphere, and thus the purity of the silica powder is enhanced. In particular, as the atmosphere in the mold reaches a high-temperature atmosphere, in which the silica powder can melt in a short period of time, due to the supplied oxygen gas and hydrogen gas, the degassing process can be easily conducted, thereby significantly suppressing entry of the bubbles into the product crucible. In addition, as the fine powder of graphite which constitutes the electrode is easily oxidized at a high temperature and released to the ambient air, entry of graphite powder into the product crucible is suppressed. Further, the aforementioned supplied gases are diffused into the product crucible and serves so as to reduce the inner pressure of the bubbles.

In particular, according to the third aspect of the present invention, the silica powder is accumulated, in the softened state, on the melting surface of the silica glass which has already been formed. Therefore, the silica powder comes into easy contact with the melting surface and thus the impurities deposited on the melting silica surface are easily removed.

According to the fourth and the fifth aspects of the present invention, the silica powder is supplied by blowing it with gases. Therefore, the direction of supplying the substances can be controlled by adjusting the direction of the double-wall cylinder. According to the sixth aspect of the present invention, the silica powder is surrounded with gases at the distal end portion of the double-wall cylinder and thus can have excellent contact with the gases. According to the seventh aspect of the present invention, the temperature of the melting layer of the quartz is prevented from dropping, the melting layer continues to react with the atmospheric gases and thus removal of the impurities which could cause generation of the bubbles is further accelerated.

The present invention provide following aspects in making an opaque layer. As an eighth aspect, a method of producing a silica glass crucible, in which silica powder is melted by arc discharge and a silica glass crucible is formed in a rotating mold, comprising the steps of forming an accumulated layer of the silica powder on inner surface of the mold; supplying helium and/or hydrogen (helium represents them hereinafter) gas to the accumulated layer at predetermined positions located in sidewalls and a bottom portion of the mold; starting arc discharge, after supplying helium gas to the accumulated layer for a predetermined time; stopping supply of helium gas and degassing the accumulated layer, when a thin film-like melting layer has been formed on the surface of the accumulated layer; and starting again supply of helium gas when the accumulated layer has reached a predetermined vacuum state.

According to the eighth aspect of the present invention, helium gas is supplied into the voids of the accumulated layer in the vacuum state and the atmosphere in the voids is replaced with helium.

In the ninth aspect of the present invention, putting a cover on the upper opening portion of the mold when the accumulated layer has been formed and degassing the inside of the mold; supplying helium gas to the inside of the mold when the inside of the mold has reached a predetermined vacuum state; and removing the cover and starting arc discharge, after a pressure inside the mold has risen to a predetermined value, wherein, after removing the cover, supply of helium gas is continued for a predetermined time.

According to the ninth aspect of the present invention, as the mold is sealed by a cover, a still higher degree of vacuum can be obtained. Therefore, helium gas which is supplied thereafter is fully spread into the voids of the accumulated layer and thus the replacement by helium gas is sufficiently effected.

In the tenth aspect of the present invention, supplying helium gas to the accumulated layer through predetermined positions located in a sidewall and a bottom portion of the mold; starting arc discharge, after supplying helium gas to the accumulated layer for a predetermined time; continuing supply of helium gas and degassing the accumulated layer through upper portions of the sidewall of the mold, when a thin film-like melting layer has been formed on the surface of the accumulated layer.

Due to this aspect, there arises a flow of helium gas which passes through the accumulated layer from the lower side to the upper side, thereby effecting the replacement action allover the accumulated layer.

In the eleventh aspect of the present invention, the positions through which helium gas is supplied when the thin film-like melting layer has been formed is switched to the upper portions of the sidewall of the mold, and the accumulated layer is degassed through the positions at which helium gas was supplied prior to the arc discharge.

Due to this aspect, there arises a flow of helium gas which passes through the accumulated layer from the upper side to the lower side, thereby effecting the replacement action allover the accumulated layer.

In the twelfth aspect of the present invention, putting a cover on the upper opening portion of the mold when the accumulated layer has been formed and degassing the inside of the mold; supplying helium gas to the inside of the mold through predetermined positions located in sidewalls and a bottom portion of the mold, when the inside of the mold has reached a predetermined vacuum state; and removing the cover and starting arc discharge, after a pressure inside the mold has risen to a predetermined value, wherein, supplying of helium gas is continued and the accumulated layer is degassed at upper portions of the sidewall of the mold, when a thin film-like melting layer has been formed on the surface of the accumulated layer.

In the thirteenth aspect of the present invention, the positions through which helium gas is supplied when the thin film-like melting layer has been formed is switched to the upper portions of the sidewall of the mold, and the accumulated layer is degassed through the positions at which helium gas was supplied prior to the arc discharge.

According to the eighth through eleventh aspects of the present invention, as the voide in the accumulated layer is replaced by helium gas, bubbles mixed in the surface layer of the silica crucible are prevented from expansion at higher temperature atmosphere (1450~1700° C.) during the semiconductor single crystal pulling process. Therefore, heat conductivity of the silica glass crucible is not go down, then the silica glass crucible is prevented from unusual rise of temperature.

Furthermore, in the fourteenth aspect of the present invention, further comprising the steps of: supplying at least one type of gas selected from the group consisting of hydrogen, oxygen, water vapor, helium, neon gases to the mold; and passing the silica powder through atmosphere of the at least one type of gas supplied at the gas supplying step and then supplying the silica powder to inner surface of the mold.

In the fifteenth aspect of the present invention silica powder is dispersed inside the mold, such that the silica powder is softened in atmosphere of the arc discharge prior to the silica powder reaching the inner surface of the mold.

BRIEF DESCRIPTION OF DRAWINGS

FIG. 8 is a sectional view of main portions of a device for producing a silica glass crucible according to a fourth embodiment of the present invention.

FIG. 9 is a sectional view of main portions of a device for producing a silica glass crucible according to a fifth embodiment of the present invention.

FIG. 10 is a view in which the bubbles present in an opaque layer of the silica glass crucible of the fourth and the fifth embodiments before use is compared with the bubbles present in the opaque layer of the same silica glass crucible after use.

BEST MODE FOR EMBODYING THE INVENTION

Figures 1, 2:
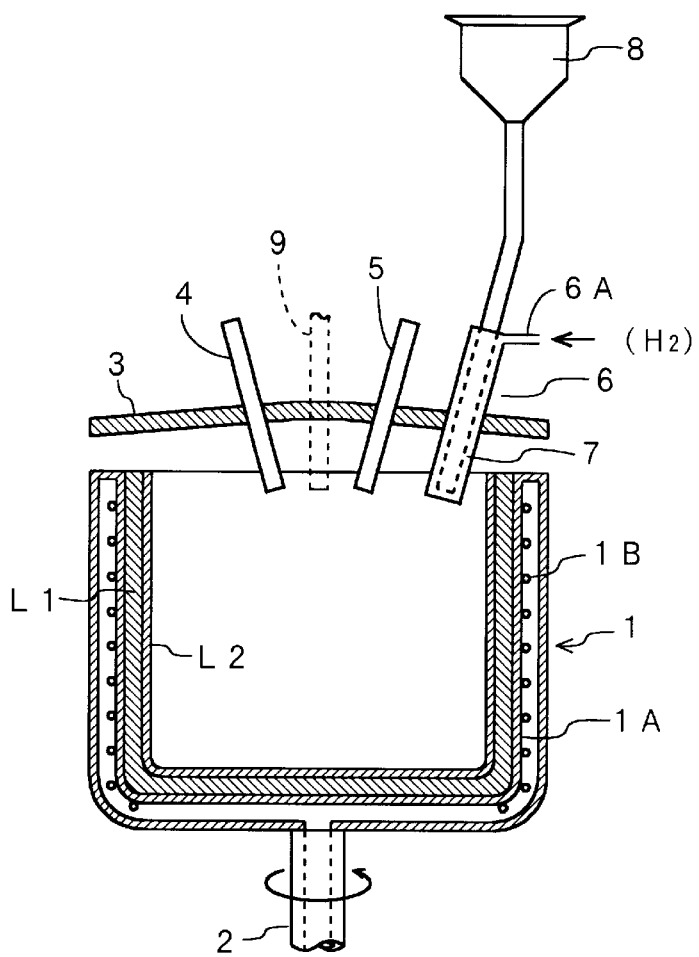
FIG. 1 is a sectional view of main portions of a device for producing a silica glass crucible according to a first embodiment of the present invention.
FIG. 2 is a table which shows a relationship between the diameter of the bubbles and the yield of the crystal.

The present invention will be described hereinafter according to the following embodiments. In a first embodiment, a means for reducing the number, the size and the expansion ratio of the bubbles present in a transparent layer formed in the inner surface of a silica glass crucible, is provided.

First, the number and the size of the bubbles are reduced by eliminating nitrogen gas, alkaline-earth metal and the like remaining between every particles of silica powder as the raw material, because such nitrogen gas, alkaline-earth metal and the like are the source of the air bubbles. More specifically, by introducing at least one of the gases selected from the group consisting of hydrogen, oxygen, water vapor, helium, neon gases and the like (when more than two types of gases are selected, the gases are introduced in the mixed state), a silica glass crucible having a relatively small number of the bubbles can be obtained. Such a silica glass crucible is obtained because the temperature inside a mold becomes very high by introducing the aforementioned gas (es) at the time of arc discharge. In a case of the conventional arc Verneuills method in which the aforementioned gas(es) is not introduced, as the temperature inside the mold increases, the surface of the raw material is sintered in the vicinity of 1650° C. and then begins to melt in the vicinity of 1750° C. On the other hand, in the present embodiment, by shortening the time required before completing the sintering process and bringing the material to the melted state in a relatively short time of period, the degassing process is accelerated and thus the number of the bubbles mixed into the crucible can be reduced. It should be noted that, in particular, when oxygen gas and hydrogen gas are introduced during the arc discharge, the temperature inside the mold reaches a desired high temperature rapidly. The degree of sintering of the raw material can be set at a relatively low level in such a high-temperature atmosphere.

Second, in the present embodiment, the expansion ratio of the bubbles is reduced by reducing the inner pressure of the bubbles. The expansion ratio of the bubbles can be reduced by introducing hydrogen gas and oxygen gas during the arc discharge, in a manner similar to the method described above. The aforementioned gas(es) (hydrogen gas, oxygen gas and the like) which is introduced to the raw material is diffused into the silica glass crucible and the bubbles present in the silica glass crucible, and is easily dissolved into the silica glass. Hydrogen, helium and neon are diffused quickly, in particular, and are easily dissolved into the silica glass. The atoms of such gases whose atom-radius is relatively small can freely travel in the silica matrix of the silica glass. As a result, such gases are easily released out of the silica glass under a low-pressure and high-temperature condition, thereby lowering the inner pressure of the bubbles and suppressing the increase in volume thereof.

Third, in the present invention, the number, and the expansion ratio of the bubbles are reduced by eliminating graphite which comes from the graphite electrodes. A silica glass crucible is produced by melting and solidifying the raw materials in a mold. The heat needed for melting is obtained from the arc discharge by the graphite electrodes. Most of the graphite (debris) derived from the graphite electrodes is combined with oxygen in the mold and combusted. However, some of the graphite debris remains in the produced silica glass crucible, forms the bubbles and serves to increase the expansion ratio of the bubbles. This phenomenon occurs because the remaining graphite reacts with oxygen which is trapped together in the bubble, generates carbon monoxide gas and increases the volume of bubbles under the low-pressure and high-temperature condition (i.e., the condition during the pulling process).

Therefore, in order to prevent graphite from entering the inner surface of the silica glass crucible, the gases such as hydrogen, oxygen, water vapor, helium, and neon are introduced into the material at the time of the arc discharge. Graphite debris is combined with the introduced oxygen and combusted as described above. In addition, as the other gases are also introduced as described above, the temperature inside the mold becomes extremely high and the graphite debris is more easily combined with oxygen in the air and more easily combusted. Hydrogen, oxygen, water vapor particularly accelerate the oxidation of graphite.

Next, a specific method of producing a silica glass crucible and the results of measurement of the expansion ratio of the bubbles present in a transparent layer of a produced silica glass crucible will be described. In the first embodiment, hydrogen gas is introduced into the mold. FIG. 1 is a sectional view of main portions of a device for producing a silica glass crucible. In FIG. 1, a mold 1 has a double-wall structure made of metal (preferably, stainless steel), and is adapted to be water cooled by cooling water which flows inside a tube 1B provided in an inner wall 1A. The inner diameter of the mold 1 is 570 mm and the mold 1 is rotated around a shaft 2 by a rotating device (not shown). A pair of graphite electrodes 4, 5 are retained on a heat-blocking plate (cover) 3 provided at the center-upper portion of the mold 1.

A gas nozzle 6 and an introducing tube 7 for introducing silica powder as the raw material form a double-wall cylinder, and this double-wall cylinder is provided adjacent to the graphite electrode 4. The introducing pipe 7 forms the inner wall (cylinder) of the double-wall cylinder and the gas nozzle 6 forms the outer wall (cylinder) of the double-wall cylinder. However, the gas nozzle 6 may form the inner wall (cylinder) of the double-wall cylinder and the introducing pipe 7 may form the outer wall (cylinder) of the double-wall cylinder. When the double-wall cylinder is structured so as to introduce silica powder through the inner cylinder and introduce gases through the outer cylinder, it is preferable that the inner and outer cylinders are structured such that the distal end of the inner cylinder is retracted with respect to the distal end of the outer cylinder (i.e., such that the distal end of the inner cylinder is completely covered with the outer cylinder) as shown in FIG. 1. By structuring the double-wall cylinder in such a manner, silica powder is fully surrounded with gases and reliably comes in excellent contact with the gases.

In the present embodiment, silica powder is used as the raw material. However, what is represented by the term "silica powder" is not limited to quartz but also includes powder materials known as the raw materials for a silica glass crucible, such as crystals, siliceous sand and the like which contains silicon dioxide (silica). The inlet 6A of the gas nozzle 6 is connected to pipelines for hydrogen gas or a gas cylinder (not shown) and the upper end of the introducing tube 7 is connected to a hopper 8 in which silica powder is provided. A gas introducing tube 9 may additionally be provided between the graphite electrode 4 and the graphite electrode 5.

Process of producing a crucible by the producing device structured as described above will be described hereinafter. First, the mold 1 is rotated and silica powder (whose particle degree is 60# (meshes per inch)—150#, for example) is provided to the inner peripheral surface of the mold 1 by way of the introducing tube 7. As the mold is being rotated, the provided silica powder is attached to the inner (peripheral) surface of the mold 1 due to the centrifuging force and accumulated thereon. The silica powder may be provided to the mold 1 by either the introducing tube 7 or any other suitable device. When a predetermined amount of silica powder has been accumulated, an electricity is applied between the graphite electrodes 4, 5 such that the arc discharge is effected. The silica powder which has been attached to the mold 1 is melted due to the arc heat and an opaque layer L1 (refer to FIG. 1), which constitutes the outer peripheral surface of the silica glass crucible, is formed.

After the formation of the opaque layer L1, a transparent layer L2 (refer to FIG. 1) is subsequently formed. 5 to 10 minutes after the start of melting of the accumulated silica powder, the silica powder and hydrogen gas are supplied to the mold 1 by passing through the introducing tube 7 and the gas nozzle 6. Here, it is preferable that the silica powder is provided at the rate of 80 to 160 g/minute and hydrogen gas is provided at the rate of 60 to 100 liter/minute.

The temperature of the atmosphere in the vicinity of the arc of the graphite electrodes 4, 5 is 2000° C. or higher (5000° C. or higher in the arc) and the silica powder dispersed in the atmosphere is softened. The softened silica powder is directly transferred onto the opaque layer L1 or is raised up to the opaque layer L1 due to the centrifuging force once it is dropped to the bottom of the mold, and is accumulated on the opaque layer L1, thereby forming the transparent layer L2.

The silica powder, which has reached the softened state after being applied together with hydrogen gas in the vicinity of the arc, increases its purity because the impurities attached to the surface of the silica powder such as air, moisture, alkaline-earth metals and heavy metals are replaced with hydrogen gas or combusted in the high-temperature atmosphere. As a result, the amount of the gas trapped in the transparent layer L2 (the remaining gas) which is potentially the source of the bubbles can be reduced. In addition, if some amount of gas is trapped in the transparent layer, since such a remaining gas is reliably replaced with hydrogen gas which is highly diffusive (hydrogen gas can travel freely in the silica matrix of the silica glass as described above), the remaining gas is easily released out of the silica glass under the condition of low-pressure and high-temperature. Accordingly, explosion due to volume increase of bubbles is unlikely to occur.

In order to reduce the amount of the remaining gas trapped in the transparent layer L2 as much as possible, it is preferable that the temperature of the quartz surface layer in the melted state is maintained at a high temperature (2000° C. or higher). The higher the temperature is, the more remaining gas is released from the melted surface layer to the atmosphere. It is preferable that the silica powder is intermittently dispersed, because, if silica powder is continually provided, the temperature of the surface layer in the melted state may drop. Accordingly, dispersion of the silica powder and introduction of hydrogen gas are carried out for 10 minutes, and then dispersion of the silica powder is stopped for 20 minutes while continuing the melting operation during the period, for example. By repeating this operation, the transparent layer L2 having a predetermined thickness can be formed. It should be noted that introduction of hydrogen may be continued while the dispersion of the silica powder is stopped, so that hydrogen gas continues to act on the remaining gas of the melted surface layer.

Figures 3, 4:
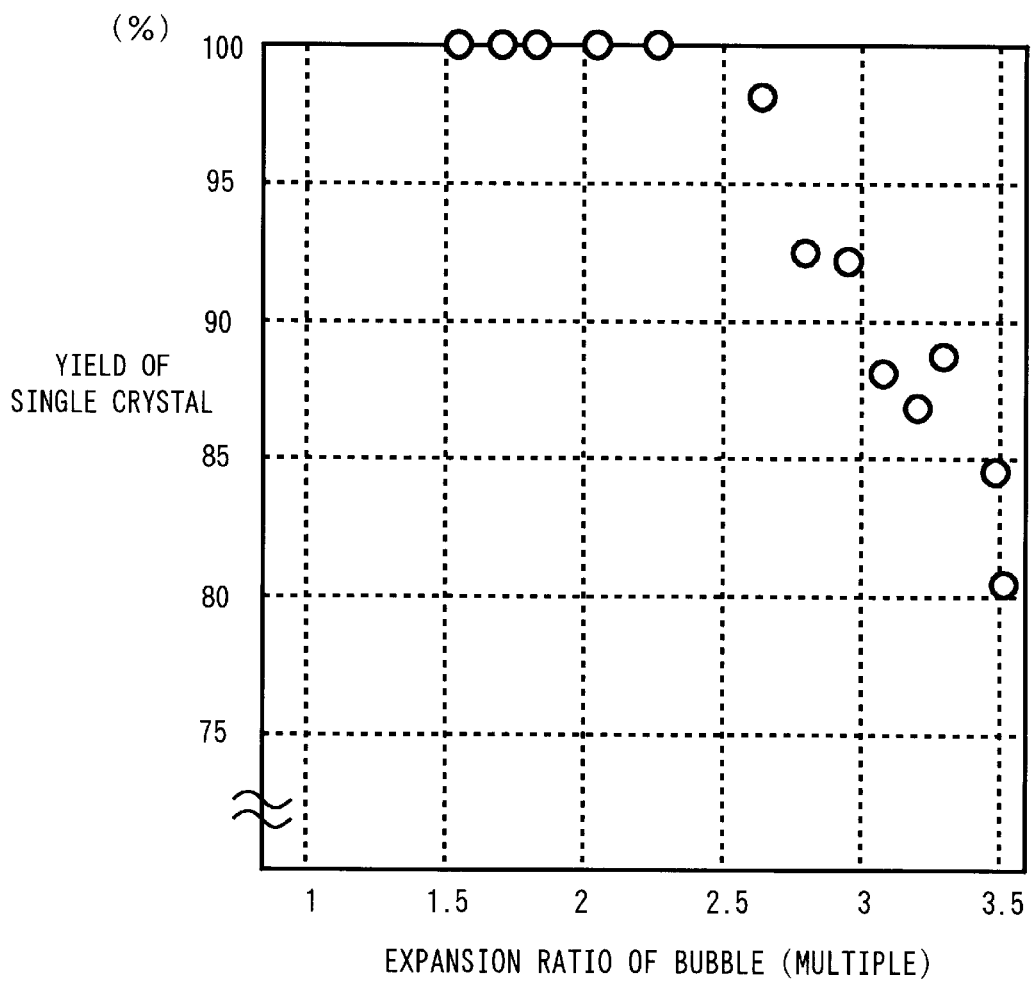
FIG. 3 is a table in which the bubbles of the silica glass crucible before use is compared with the bubbles of the silica glass crucible after use.
FIG. 4 is a graph which shows a relationship between the expansion ratio of the bubbles and the yield of the single crystal yield.

With respect to a silica glass crucible produced as described above, the number, the size, and the volume increasing rate of the bubbles were investigated. FIG. 3 is a table which shows the results of a research in which the number and the size of the bubbles after use of the crucible is compared with the number and the size of the bubbles before use, with respect to a silica glass crucible produced by the production method of the present embodiment. The bubbles before use of the crucible were observed, by setting a microscope (with a magnifying power of 20) at an inner corner portion of the silica glass crucible and observing the area depthwise between the inner peripheral surface and the 0.5 to 1.5 mm depth point at each corner portion, with respect to 20 sites (samples).

The observation of the bubbles after use of the crucible was carried out with respect to the samples, which were obtained by cutting the corner portions of the silica glass crucible after use off, etching the cut section with 15% acid ammonium fluoride for 30 minutes at the room temperature and washed by super pure water shower. The observation was carried out, in a similar manner to the before-use case, at the area depthwise between the inner peripheral surface and the 0.5 to 1.5 mm depth point at a corner portion of the silica glass crucible, with respect to 20 sites (samples). Here, the sample of "after use" represents the silica glass crucible which has been used for a pulling process in which 100 kg of silicon was pulled after 50 hours according to the CZ method.

As shown in FIG. 3, the maximum size (diameter) of the bubbles before use was 51 μm, the minimum size (diameter) thereof was 3 μm, the average was 13 μm. The maximum size (diameter) of the air bubbles after use was 90 μm, the minimum size (diameter) thereof was 9 μm, the average was 34 μm. The number of the air bubbles present in the silica glass crucible was 0.14/mm3 before use and 0.27/mm3 after use. As described above, the average size of the bubbles after use was 34 μm. The yield of the single crystal was 100%, matching with the results described with respect to FIG. 2.

Next, the results of a research which investigated the relationship between the volume increasing rate of the bubbles and the yield will be described hereinafter. According to the aforementioned production method, but with varying the introduced amount of hydrogen gas between 0 to 60 liter/minute, 13 types of silica glass crucibles of 22 inches (diameter) were produced. With respect to these silica glass crucibles, the volume increasing rate of the bubbles (bubble diameter after use/bubble diameter before use) and the yield of the single crystal were investigated and the relationship between the two rates were studied. FIG. 4 is a graph which shows the relationship between the volume increasing rate of the bubbles and the yield of the single crystal. When the yield was investigated, the conditions with respect to the use/observation of the silica glass crucibles were the same as those described with respect to FIG. 3.

As shown in FIG. 4, the volume increasing rate of the bubbles of the 13 types of silica glass crucibles distributes in a range of 1.5 to 3.5. As understood from FIG. 4, the samples in which the volume increasing rate of the bubbles is less than "2.5%" show an excellent result of the yield of the single crystal (100%).

As described above, according to the present embodiment, contaminants resulted from factors outside the operation environment (typically, trapping of the ambient air) and impurities contained in the raw material powder are intensively eliminated. As a result, the amount of inactive gases trapped in the transparent layer of the silica glass crucible can be reduced to an extremely or ultimately low level.

Figure 5:
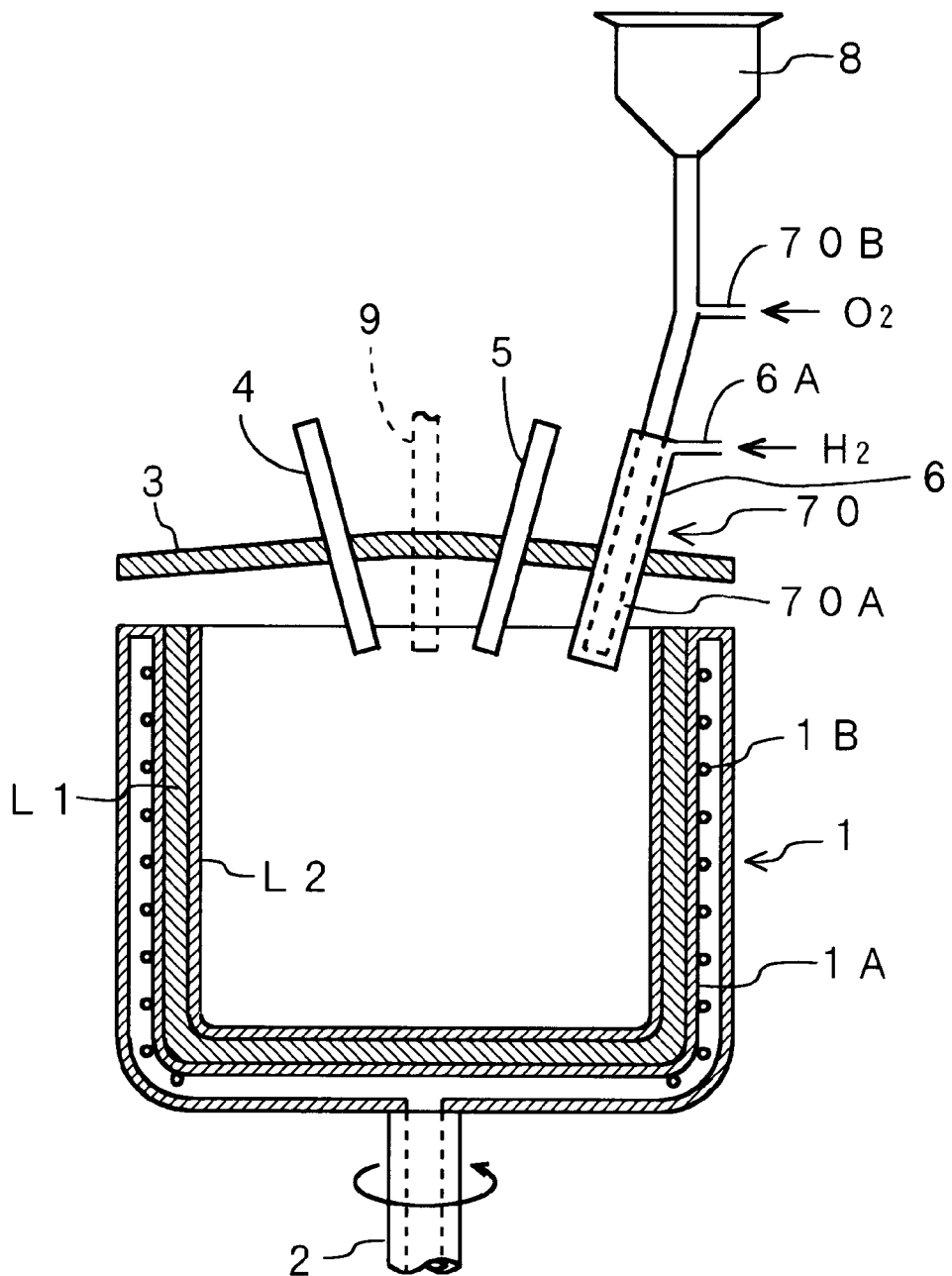
FIG. 5 is a sectional view of main portions of a device for producing a silica glass crucible according to a second embodiment of the present invention.

Next, a second embodiment of the present invention will be described. In the aforementioned first embodiment, the crucible is produced by introducing hydrogen gas. In the second embodiment, oxygen gas and hydrogen gas are introduced. FIG. 5 is a sectional view of main portions of a device for producing a silica glass crucible according to the second embodiment. The same reference numbers as in FIG. 1 are designated to the portions of FIG. 5 which are the same as or equivalent to FIG. 1. In FIG. 5, a double-wall cylinder 70 is formed by an introducing tube 70A as the inner cylinder and an gas nozzle 6 as the outer cylinder. The introducing tube 70A as the inner cylinder is structured so as to be able to supply the raw material powder by way of a hopper 8. The introducing tube 70A also has a branched tube or an inlet 70B at midway thereof so as to be able to introduce oxygen gas. On the other hand, the gas nozzle 6 as the outer cylinder of the double-wall cylinder 70 has an inlet 6A for introducing hydrogen gas, in a manner similar to the first embodiment.

In the aforementioned structure, as the silica powder and oxygen gas are injected together from one common tube (i.e., the introducing tube 70A), the silica powder can be supplied to the mold from any desired direction by adjusting the direction of the introducing tube 70A. However, the present invention is not limited to this structure, and the silica powder and oxygen gas may be separately supplied to the mold 1 by using different nozzles.

In operation, an opaque layer L1 is formed at first in a manner similar to the first embodiment. After forming the opaque layer L1, a transparent layer L2 (refer to FIG. 1) is subsequently formed. 5 to 10 minutes after the start of melting of the accumulated silica powder, silica powder, oxygen gas and hydrogen gas are supplied to the mold 1 through the double-wall cylinder 70. Here, similarly to the first embodiment, it is preferable that the silica powder is supplied at the rate of 80 to 160 g/minute, for example, and oxygen gas and hydrogen gas are supplied as a whole at the rate of 60 to 100 liter/minute. In addition, it is preferable that the ratio of the supply amount of oxygen gas with respect to the supply amount of hydrogen gas is 1:6. When the supply amount of oxygen gas is too large, the amount of the bubbles may rather increase. When the supply amount of hydrogen gas is to be increased at the maximum level, the aforementioned ratio between oxygen and hydrogen can be 1:10.

The silica powder dispersed in the atmosphere in the vicinity of the arc of the graphite electrodes 4, 5 is softened. The softened silica powder is directly transferred onto the opaque layer L1 or is raised up to the opaque layer L1 due to the centrifuging force once it is dropped to the bottom of the mold, and is accumulated on the opaque layer L1, thereby forming the transparent layer L2. In particular, the silica powder, which has passed through the atmosphere in which the temperature has risen high as a result of introduction of oxygen and hydrogen, softens very easily.

The transparent layer L2 formed by the silica powder which has reached the softened state as a result of being introduced in the vicinity of the arc with oxygen gas and hydrogen gas, has a relatively small amount of remaining gas which becomes the source of the bubbles. Even if a small amount of gas remains in the transparent layer L2, as the environment is hydrogen rich, the remaining gas is easily purged out of the silica glass under a low-pressure and high-temperature condition in a manner similar to the case in which only hydrogen gas is introduced.

When a silica glass crucible is produced in a condition in which hydrogen gas flow ratio is high, the inside of the crucible is in the hydrogen rich state, as described above. As hydrogen gas is present so amply, the hydrogen rich state inside the silica glass crucible can reliably be maintained, although some hydrogen gas reacts with oxygen gas which enters the silica glass crucible from the air due to the convection generated during the pulling process of semiconductor single crystals, to form a vapor. The vapor generated during the pulling process is released from the upper portion of the silica glass crucible due to the high-temperature convection of the arc discharge, without coming into contact with the inner surface of the silica glass crucible.

The results of the comparison of the number and the size of the bubbles present in the silica glass crucible of the second embodiment after use, with those of the silica glass crucible before use, are similar to the results obtained in the first embodiment. In addition, the results of the volume increasing rate of the bubbles in the same silica glass crucible were similar to the results obtained in the first embodiment.

In the second embodiment, oxygen gas is introduced together with the raw material powder through the inner cylinder of the double-wall cylinder and hydrogen gas is introduced through the outer cylinder. However, this structure may be constructed in a reversed manner. That is, hydrogen gas may be introduced together with the raw material powder through the inner cylinder and oxygen gas may be introduced through the outer cylinder. Further, the present embodiment is not limited to the structure in which oxygen gas and hydrogen gas are introduced separately. Both gases may be mixed in advance, so that the mixed gas is introduced.

Next, a production method for stabilizing the heat conductivity in the outer surface layer or the opaque layer of the silica glass crucible will be described. In order to make the heat conductivity of the opaque layer stable, helium gas is introduced from the pot or the mold for melting the silica powder and the gases in the voids of the silica powder accumulated in the inner wall surface of the mold is replace with helium gas. The details thereof will be described hereinafter with reference to the drawings.

Figures 6, 7:
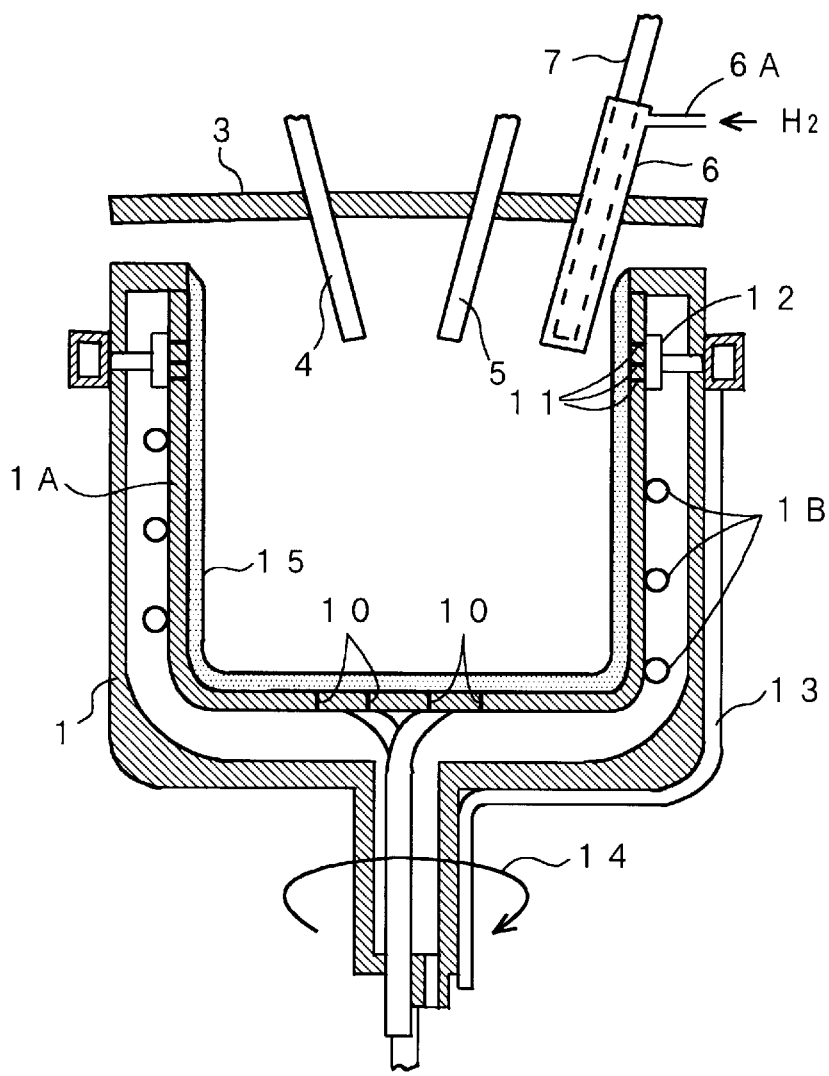
FIG. 6 is a sectional view of main portions of a device for producing a silica glass crucible according to a third embodiment of the present invention.
FIG. 7 is a table in which the bubbles present in an opaque layer of the silica glass crucible before use is compared with the bubbles present in the opaque layer of the silica glass crucible after use.

FIG. 6 is a sectional view of main portions of a production device which is used in the method for producing a silica glass crucible according to a third embodiment. The same reference numbers as in FIG. 1 are designated to the portions of FIG. 6 which are the same as or equivalent to FIG. 1. The end portion of a cooling water pipe 1B fixed to an inner wall 1A of the hollow portion of the mold 1, is extended downward the mold 1 and connected to a circulation device (not shown). Bores 10 for introducing helium as a replacing gas are formed at the bottom portion of the inner wall 1A of the mold 1. It should be noted that the bores 10 for introducing helium gas may be formed not only at the bottom portion but also at any positions between the bottom portion and the side wall of the mold 1 (refer to FIG. 9 which will be described later). The hollow portion of the double-wall mold 1 is filled with helium gas, which is supplied from the bottom portion of the mold 1. The helium gas filled in the hollow portion upwardly passes through the inner wall 1A by way of the holes 10. On the other hand, holes 11 for discharging gases are formed in the inner wall in the vicinity of the upper end of the mold 1 (that is, at the portion in the vicinity of the upper opening of the mold 1). Each hole 11 is connected with a joint 12, and a tube 13 which extends downward of the mold 1 and communicates with a vacuum pump (not shown) is connected to the joint 12. The tube 13 may be structured such that the tube 13 passes through the hollow portion of the mold 1 and is extended downwardly.

The inner diameter of the mold 1 is 570 mm, for example, and is rotated by a rotating device (not shown) as shown in the arrow 14. Accumulated layer 15 of the raw material is formed on the wall surface of the mold 1, prior to the generation of the arc between the electrodes 4, 5. The inlet 6A of the gas nozzle 6 is connected to hydrogen gas pipelines or a gas cylinder (not shown). The upper end of the introduction tube 7 is connected to a raw material hopper accommodating silica powder, in a manner similar to the production device of FIG. 1.

The process steps required when a silica glass crucible is produced by using the aforementioned production device will be described. First, the accumulated layer 15 of the silica powder is formed. The preferable particle degree and amount to be supplied of the silica powder are similar to those of the first embodiment. When the accumulated layer 15 having a predetermined thickness has been formed, the melting process of the accumulated layer 15 is started by effecting the arc discharge between the graphite electrodes 4, 5.

Prior to the arc discharge, introduction of helium gas to the accumulated layer 15 is started by way of the bores 10 of the mold 1. It is preferable that the helium gas is supplied at the rate of 30 liter/minute or so. After supplying helium gas for approximately 5 minutes, the arc discharge is conducted. A thin melting layer is formed on the surface of the accumulated layer 15 in 1 to 2 minutes after starting the arc discharge. The introduction of helium gas is stopped when this thin film-like melting layer has been formed, and the portion of the accumulated layer 15 which has not been melted is degassed by way of the holes 11. When the degree of vacuum inside the mold 1 has reached a predetermined level (30 torr, for example) due to this degassing process, introduction of helium gas is started again. It is also acceptable that the supply of helium gas is not completely stopped when the thin film-like melting layer is formed and the supply of helium gas is continued at a low rate (less than 10 liter/minute).

As helium gas is introduced when the degree of vacuum has reached a high level in a third embodiment, helium gas is effectively absorbed to the portion of the accumulated layer 15 which has not been melted and thus the air in the voids (space) of the accumulated layer 15 is effectively replaced with the helium gas. Since the air in the voids of the accumulated layer 15 is replaced with helium gas, the bubbles present in the opaque layer which is formed as a result of the melting of the accumulated layer 15 contain very little amount of nitrogen gas and oxygen gas, thereby showing a relatively small volume increasing rate. It should be noted that, the introduction of helium gas which is started again after the degassing process may be stopped after a predetermined time or may be continued at a low supply rate (less than 10 liter/minute).

After an opaque layer having thickness of 10 mm or so has been formed, a transparent layer is formed on the opaque layer. More precisely, a transparent layer is formed on the silica glass crucible inner surface side of the opaque layer. The transparent layer is formed, in a manner similar to that of the first embodiment, in which hydrogen gas is introduced through the gas nozzle 6 simultaneous with dispersing the silica powder to the mold 1 through the introducing tube 7.

FIG. 7 is a table showing the results of a research conducted with respect to the number, the diameter size, and the volume increasing rate of the bubbles present in the opaque layer. The observation of the bubbles in the crucible before use/after use was carried out in a manner similar to that of the transparent layer research. The unit of the number of the bubbles is (number)/mm3, and the unit of the diameter size of the bubbles is $\mu$m. As shown in FIG. 7, the number and the diameter size of the bubbles present in the crucible before use are substantially the same in both the conventional silica glass crucible and the improved silica glass crucible produced by the production method of the present third embodiment. However, with respect to the diameter size of each bubble, a significant improvement is observed in the improved silica glass crucible according to the present third embodiment. The number, the diameter size, and the volume increasing rate of the bubbles present in the transparent layer of the silica glass crucible of the third embodiment were similar to those of the first embodiment.

A modified example of the method of forming the opaque layer will be described. FIG. 8 and FIG. 9 are sectional views of devices employed in the production method according to the present modified example. FIG. 8 and FIG. 9 each show only the main portions of the mold 1 and the electrodes 4, 5, the cooling water pipeline 1B and the like are not shown. The same reference numbers as in FIG. 6 are designated to the portions of FIGS. 8 and 9 which are the same as or equivalent to FIG. 6. In a device of a fourth embodiment shown in FIG. 8, bottom portion holes 10 are formed at the bottom portion of the inner wall 1A of the mold 1, and a side bore 16 is formed at the side portion. A vacuum pump 18 and helium gas supply source 19 are connected to the bottom of the mold 1 by way of a changeover switch means 17. A cover 20 is put on the mold 1 until the arc discharge by the electrodes 4, 5 is started.

After the accumulated layer 15 is formed in this manufacturing device, the cover 20 is put on the upper opening portion of the mold 1, and the inside of the mold 1 is degassed through the bottom portion holes 10 and the side holes 16 by driving the vacuum pump 18. When the inside of the mold 1 has reached the predetermined vacuum state or degree (1 to 5 torr, for example), the switch means 17 is switched to the side of helium gas supply source 19, such that helium gas is supplied to the inside of the mold 1 by way of the bottom portion holes 10 and the side holes 16. When the pressure inside the mold 1 has risen to the predetermined level (for example, when the pressure inside the mold 1 has reached the ambient atmosphere), the process is shifted to the step of opening the cover 20 and starting the arc discharge. The introduction of helium gas is continued even after the cover 20 is opened and the arc discharge is started. It is preferable that the introduction of helium gas is continued at least until the thin film like-melting layer is formed on the surface of the accumulated layer 15.

On the other hand, in the device of a fifth embodiment shown in FIG. 9, bottom portion holes 10 are formed at the bottom portion of the inner wall 1A of the mold 1 and, in the side portion of the device, an upper portion holes 11 are further formed above the side holes 16 (in addition to the side holes 16). The side holes 16 communicate with the bottom portion holes 10. In the device shown in FIG. 9, after the accumulated layer 15 has been formed on the inner surface of the mold 1, helium gas is supplied to the accumulated layer 15 by way of the side holes 16 and the bottom portion holes 10, and after supplying helium gas for a predetermined time (for 5 minutes, for example), the arc discharge is performed. When a thin film-like melting layer has been formed on the surface of the accumulated layer 15 due to the arc discharge, the accumulated layer 15 is degassed through the upper portion holes 11 formed at the upper portion of the side wall of the mold 1, while the introduction of helium gas is continued. As a result of the supply of helium gas and degassing described above, there arises a flow of helium gas which flows in the accumulated layer 15 from the lower portion to the upper portion thereof. Gases remaining in the voids of the accumulated layer 15 is replaced with the helium gas introduced in such a manner.

The aforementioned flow of helium gas may be directed so as to flow in the accumulated layer 15 from the upper portion to the lower portion thereof. For example, after supplying helium gas for a predetermined time (5 minutes, for example) to the accumulated layer 15 through the side holes 16 formed in the side wall and the bottom portion holes 10 formed in the bottom portion of the mold 1, the process is shifted to the step of starting the arc discharge. Then, when the thin film-like melting layer is formed on the surface of the accumulated layer 15, the supply position of helium gas is switched to the upper portion holes 11 formed in the side wall of the mold 1, and degassing is carried out with respect to the accumulated layer 15 at the position where helium gas was supplied before the arc discharge (i.e., through the bottom portion holes 10 and the side holes 16 of the mold 1). As a result, helium gas begins to flow downwardly. In order to change the positions at which supply/degassing of helium gas is carried out, the helium gas supply source 19 is connected to two tubes 21, 22 extended from the bottom portion of the mold 1, by way of a changeover switch means 23.

In a case in which a flow of helium gas is generated in the accumulated layer 15 by using the device shown in FIG. 9, as is in the modified example shown in FIG. 8, it is acceptable that the cover 20 is put on the mold 1 so as to form a sealed space, the inside of the mold 1 is vacuumed prior to generation of the arc discharge and the atmosphere therein is replaced with helium gas by introducing helium gas.

A film containing water is present around the silica powder. Therefore, it is preferable that such moisture is removed in advance. Moisture can be removed by preheating the accumulated layer 15 prior to generation of the arc. For example, by (removably) providing a halogen lamp in the mold 1 so that the halogen lamp is directed to the accumulated layer 15 and raising the temperature inside the mold 1 to about 100° C., the accumulated layer 15 can be heated during the degassing process. By removing moisture around the silica powder in advance, the replacement process by helium gas can be carried out in a shorter time. Alternatively, the accumulated layer 15 may be heated by heaters incorporated in the cover 3 or the cover 20.

FIG. 10 is a table showing the results of a research conducted with respect to the number, the diameter size, and the volume increasing rate of the bubbles present in the opaque layer of the silica glass crucible produced by the production methods of the fourth and the fifth embodiments. In FIG. 10, the second sample II is the silica glass crucible obtained by the fourth embodiment, in which helium gas is introduced so as to generate the arc after the mold 1 with the cover 20 has been vacuumed to 5 torr. The third sample III is the silica glass crucible obtained by the fifth embodiment, in which a flow of helium gas is generated in the accumulated layer 15 which is vacuumed to 160 torr. The sample silica glass crucible III exhibits a higher volume increasing rate of the bubbles than that of the sample silica glass crucible II. However, the relatively high volume increase rate of the bubbles of the sample silica glass crucible III can be lowered by heating the accumulated layer 15 by the aforementioned halogen lamp or the like when the sample III is produced. The volume increasing rate of the sample II can also be further lowered by likewise heating the accumulated layer 15.

As described above, according to the present embodiment, contaminants resulted from factors outside the operation environment (typically, trapping of the ambient air) and impurities contained in the raw material powder are intensively eliminated. As a result, the amount of inactive gases trapped in the transparent layer of the silica glass crucible can be reduced to an extremely or ultimately low level.

Although a case in which hydrogen gas is used as the introducing gas has been described above, similar excellent results (improvement in the number, the diameter size and the like of the bubbles, and better yield of single crystals) can be likewise obtained in cases in which introducing gases other than hydrogen gas (at least one type of gas selected from the group consisting of oxygen, water vapor, helium and neon) are used under the same conditions.

Further, with respect to the gas supplied from the mold 1 in the third to fifth embodiments, the type of the gas is not limited to helium gas, and other types of rapidly-diffusing gas (such as hydrogen) or the mixture of helium gas and hydrogen may be used.

Industrial Applicability

As is obvious from the aforementioned description, according to the invention defined by claims 1 to 8, by introducing gas(es) such as oxygen and hydrogen into the arc, the influence of the high temperature can be brought not only to the silica powder being dispersed but also to the melting layer, thereby allowing effective removal of impurities present in the silica powder. As a result, bubbles derived from the impurities are reduced, and thus entry of the bubbles into the inner surface layer of the crucible can be effectively prevented. In addition, even if some bubbles enter or are trapped in the inner surface layer, as most of the trapped bubbles are replaced with the introducing gas(es), the inner pressure of the bubbles is likely to be reduced. That is, a silica glass crucible in which bubbles are not likely to explode even under a high-temperature load is provided, and a higher yield can be expected in the pulling of large-diameter semiconductor single crystals.

Further, according to the invention defined by claims 9 to 16, gases remaining in the voids of the accumulated layer of the silica powder as the raw material is replaced with helium gas. Therefore, in case some bubbles are trapped in the opaque layer of the silica glass crucible, the volume increase rate of these bubbles is likely to be small and the heat conductivity can be kept moderate when the silica glass crucible is used at a high temperature. As a result, unusual rise in temperature of the silica glass crucible can be avoided and volume increasing/explosion of the bubbles in the transparent layer can be prevented.

What is claimed is:

1. A method of producing a silica glass crucible, in which silica powder is melted by arc discharge between graphite electrodes and a silica glass crucible is formed in a rotating mold, comprising the steps of:
    supplying at least one type of gas selected from the group consisting of hydrogen, oxygen, water vapor, helium, and neon gases to the mold; and
    passing the silica powder through atmosphere of the at least one type of gas supplied at the previous gas supplying step and then supplying the silica powder to an inner surface of the mold.

2. A method of producing a silica glass crucible, in which silica powder is melted by arc discharge between graphite electrodes and a silica glass crucible is formed in a rotating mold, comprising the steps of:
    supplying hydrogen and oxygen gases to the mold; and
    passing the silica powder through atmosphere of the hydrogen and oxygen gases supplied at the previous gas supplying step and then supplying the silica powder to an inner surface of the mold.

3. A method of producing a silica glass crucible described in claim 1, wherein the silica powder is dispersed inside the mold, such that the silica powder is softened in atmosphere of the arc discharge prior to the silica powder reaching the inner surface of the mold.

4. A method of producing a silica glass crucible described in claim 2, wherein the silica powder is dispersed inside the mold, such that the silica powder is softened in atmosphere of the arc discharge prior to the silica powder reaching the inner surface of the mold.

5. A method of producing a silica glass crucible described in any of claims 1 to 3, wherein the gas and the silica powder are supplied through a double-wall cylinder which is formed by an outer cylinder and an inner cylinder contained in the outer cylinder, one of the silica powder and the gas is supplied through the inner cylinder, and the other of the silica powder and the gas is supplied through the outer cylinder.

6. A method of producing a silica glass crucible described in claim 4, wherein the gas and the silica powder are supplied through a double-wall cylinder which is formed by an outer cylinder and an inner cylinder contained in the outer cylinder, one of the silica powder and the gas is supplied through the inner cylinder, and the other of the silica powder and the gas is supplied through the outer cylinder.

7. A method of producing a silica glass crucible described in any of claims 1 to 3, wherein the gas and the silica powder are supplied through a double-wall cylinder which is formed by an outer cylinder and an inner cylinder contained in the outer cylinder, the silica powder is supplied through the inner cylinder, and the gas is supplied through the outer cylinder whose distal end extends beyond a distal end of the inner cylinder.

8. A method of producing a silica glass crucible described in claim 4, wherein the gas and the silica powder are supplied through a double-wall cylinder which is formed by an outer cylinder and an inner cylinder contained in the outer cylinder, the silica powder is supplied through the inner cylinder, and the gas is supplied through the outer cylinder whose distal end extends beyond a distal end of the inner cylinder.

9. A method of producing a silica glass crucible described in claim 2 or claim 3, wherein the gas and the silica powder are supplied through a double-wall cylinder which is formed by an outer cylinder and an inner cylinder contained in the outer cylinder, the silica powder and oxygen gas are supplied through the inner cylinder, and the hydrogen gas is supplied through the outer cylinder.

10. A method of producing a silica glass crucible described in claim 4, wherein the gas and the silica powder are supplied through a double-wall cylinder which is formed by an outer cylinder and an inner cylinder contained in the outer cylinder, the silica powder and oxygen gas are supplied through the inner cylinder, and the hydrogen gas is supplied through the outer cylinder.

11. A method of producing a silica glass crucible described in claim 9, wherein a distal end of the inner cylinder is positioned so as to be retracted with respect to a distal end of the outer cylinder.

12. A method of producing a silica glass crucible described in claim 10, wherein a distal end of the inner cylinder is positioned so as to be retracted with respect to a distal end of the outer cylinder.

13. A method of producing a silica glass crucible described in claim 1, wherein, of the silica powder and the gas, at least the silica powder is intermittenly supplied, while the arc discharge is continued.

14. A method of producing a silica glass crucible described in claim 2, wherein, of the silica powder and the gas, at least the silica powder is intermittently supplied, while the arc discharge is continued.

15. A method of producing a silica glass crucible described in claim 2, wherein, of the silica powder and the gas, at least the silica powder is intermittently supplied, while the arc discharge is continued.

16. A method of producing a silica glass crucible described in claim 4, wherein, of the silica powder and the gas, at least the silica powder is intermittently supplied, while the arc discharge is continued.

17. A method of producing a silica glass crucible described in claim 5, wherein, of the silica powder and the gas, at least the silica powder is intermittently supplied, while the arc discharge is continued.

18. A method of producing a silica glass crucible described in claim 6, wherein, of the silica powder and the gas, at least the silica powder is intermittently supplied, while the arc discharge is continued.

19. A method of producing a silica glass crucible described in claim 7, wherein, of the silica powder and the gas, at least the silica powder is intermittently supplied, while the arc discharge is continued.

20. A method of producing a silica glass crucible described in claim 8, wherein, of the silica powder and the gas, at least the silica powder is intermittently supplied, while the arc discharge is continued.

21. A method of producing a silica glass crucible described in claim 9, wherein, of the silica powder and the gas, at least the silica powder is intermittently supplied, while the arc discharge is continued.

22. A method of producing a silica glass crucible described in claim 10, wherein, of the silica powder and the gas, at least the silica powder is intermittently supplied, while the arc discharge is continued.

23. A method of producing a silica glass crucible described in claim 11, wherein, of the silica powder and the gas, at least the silica powder is intermittently supplied, while the arc discharge is continued.

24. A method of producing a silica glass crucible described in claim 12, wherein, of the silica powder and the gas, at least the silica powder is intermittently supplied, while the arc discharge is continued.

25. A method of producing a silica glass crucible, in which silica powder is melted by arc discharge and a silica glass crucible is formed in a rotating mold, comprising the steps of:

forming an accumulated layer of the silica powder on an inner surface of the mold;

supplying helium and/or hydrogen gas to the accumulated layer at predetermined positions located in sidewalls and a bottom portion of the mold;

starting arc discharge, after supplying helium and/or hydrogen gas to the accumulated layer for a predetermined time;

stopping supply of helium and/or hydrogen gas and degassing the accumulated layer, when a thin film-like melting layer has been formed on the surface of the accumulated layer; and starting again supply of helium and/or hydrogen gas when the accumulated layer has reached a predetermined vacuum state.

26. A method of producing a silica glass crucible, in which silica powder is melted by arc discharge and a silica glass crucible is formed in a rotating mold, comprising the steps of:

forming an accumulated layer of the silica powder on an inner surface of the mold;

putting a cover on the upper opening portion of the mold when the accumulated layer has been formed and degassing the inside of the mold;

supplying helium and/or hydrogen gas to the inside of the mold when the inside of the mold has reached a predetermined vacuum state; and removing the cover and starting arc discharge, after a pressure inside the mold has risen to a predetermined value, wherein, after removing the cover, supply of helium and/or hydrogen gas is continued for a predetermined time.

27. A method of producing a silica glass crucible, in which silica powder is melted by arc discharge and a silica glass crucible is formed in a rotating mold, comprising the steps of:

forming an accumulated layer of the silica powder on an inner surface of the mold;

supplying helium and/or hydrogen gas to the accumulated layer through predetermined positions located in a sidewall and a bottom portion of the mold;

starting arc discharge, after supplying helium and/or hydrogen gas to the accumulated layer for a predetermined time;

continuing supply of helium and/or degassing the accumulated layer through upper portions of the sidewall of the mold, when a thin film-like melting layer has been formed on the surface of the accumulated layer.

28. A method of producing a silica glass crucible described in claim 27, wherein the positions through which helium and/or hydrogen gas is supplied when the thin film-like melting layer has been formed is switched to the upper portions of the sidewall of the mold, and the accumulated layer is degassed through the positions at which helium and/or hydrogen gas was supplied prior to the arc discharge.

29. A method of producing a silica glass crucible, in which silica powder is melted by arc discharge and a silica glass crucible is formed in a rotating mold, comprising the steps of:

forming an accumulated layer of the silica powder on an inner surface of the mold;

putting a cover on the upper opening portion of the mold when the accumulated layer has been formed and degassing the inside of the mold;

supplying helium and/or hydrogen gas to the inside of the mold through predetermined positions located in sidewalls and a bottom portion of the mold, when the inside of the mold has reached a predetermined vacuum state; and removing the cover and starting arc discharge, after a pressure inside the mold has risen to a predetermined value, wherein, supplying of helium and/or hydrogen gas is continued and the accumulated layer is degassed at upper portions of the sidewall of the mold, when a thin film-like melting layer has been formed on the surface of the accumulated layer.

30. A method of producing a silica glass crucible described in claim 29, wherein the positions through which helium and/or hydrogen gas is supplied when the thin film-like melting layer has been formed is switched to the upper portions of the sidewall of the mold, and the accumulated layer is degassed through the positions at which helium and/or hydrogen gas was supplied prior to the arc discharge.

31. A method of producing a silica glass crucible described in claim 25, further comprising the steps of:

supplying at least one type of gas selected from the group consisting of hydrogen, oxygen, water vapor, helium, and neon gases to the mold; and passing the silica powder through atmosphere of the at least one type of gas supplied at the gas supplying step and then supplying the silica powder to an inner surface of the mold.

32. A method of producing a silica glass crucible described in claim 26, further comprising the steps of:

supplying at least one type of gas selected from the group consisting of hydrogen, oxygen, water vapor, helium, and neon gases to the mold; and passing the silica powder through atmosphere of the at least one type of gas supplied at the gas supplying step and then supplying the silica powder to an inner surface of the mold.

33. A method of producing a silica glass crucible described in claim 27, further comprising the steps of:

supplying at least one type of gas selected from the group consisting of hydrogen, oxygen, water vapor, helium, and neon gases to the mold; and passing the silica powder through atmosphere of the at least one type of gas supplied at the gas supplying step and then supplying the silica powder to an inner surface of the mold.

34. A method of producing a silica glass crucible described in claim 28, further comprising the steps of:

supplying at least one type of gas selected from the group consisting of hydrogen, oxygen, water vapor, helium and neon gases to the mold; and passing the silica powder through atmosphere of the at least one type of gas supplied at the gas supplying step and then supplying the silica powder to an inner surface of the mold.

35. A method of producing a silica glass crucible described in claim 29, further comprising the steps of:

supplying at least one type of gas selected from the group consisting of hydrogen, oxygen, water vapor, helium, and neon gases to the mold; and passing the silica powder through atmosphere of the at least one type of gas supplied at the gas supplying step and then supplying the silica powder to an inner surface of the mold.

36. A method of producing a silica glass crucible described in claim 30, further comprising the steps of:

supplying at least one type of gas selected from the group consisting of hydrogen, oxygen, water vapor, helium, and neon gases to the mold; and passing the silica powder through atmosphere of the at least one type of gas supplied at the gas supplying step and then supplying the silica powder to an inner surface of the mold.

37. A method of producing a silica glass crucible described in any of claim 31 to 36, wherein the silica powder is dispersed inside the mold, such that the silica powder is softened in atmosphere of the arc discharge prior to the silica powder reaching the inner surface of the mold.

* * * * *